(12) United States Patent
Sankaranarayanan et al.

(10) Patent No.: US 9,818,488 B2
(45) Date of Patent: Nov. 14, 2017

(54) READ THRESHOLD VOLTAGE ADAPTATION USING BIT ERROR RATES BASED ON DECODED DATA

(71) Applicant: Seagate Technology LLC, Cupertino, CA (US)

(72) Inventors: Sundararajan Sankaranarayanan, Fremont, CA (US); AbdelHakim Salem Alhussien, San Jose, CA (US); Zhengang Chen, San Jose, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 20 days.

(21) Appl. No.: 14/928,284

(22) Filed: Oct. 30, 2015

(65) Prior Publication Data

US 2017/0125111 A1    May 4, 2017

(51) Int. Cl.
| | |
|---|---|
| *G06F 11/07* | (2006.01) |
| *G11C 16/26* | (2006.01) |
| *G11C 11/56* | (2006.01) |
| *G11C 16/04* | (2006.01) |

(52) U.S. Cl.
CPC ............ *G11C 16/26* (2013.01); *G06F 11/076* (2013.01); *G06F 11/079* (2013.01); *G06F 11/0727* (2013.01); *G06F 11/0793* (2013.01); *G11C 11/5642* (2013.01); *G11C 16/0483* (2013.01)

(58) Field of Classification Search
CPC ............ G06F 11/1012; G06F 11/1048; G06F 11/1068; G06F 11/1008; H03M 13/1108; H03M 13/1111; H03M 13/2906; H03M 13/2948; H03M 13/09; H03M 13/112
See application file for complete search history.

(56) References Cited

U.S. PATENT DOCUMENTS

| | | | |
|---|---|---|---|
| 6,466,614 B1 | 10/2002 | Smith | |
| 9,037,946 B2* | 5/2015 | Jeon | G11C 16/3404 |
| | | | 714/721 |
| 9,043,678 B2* | 5/2015 | Jeon | G11C 16/3404 |
| | | | 714/721 |
| 9,263,138 B1* | 2/2016 | Wilson | G11C 16/10 |

(Continued)

OTHER PUBLICATIONS

Peleato et al., "Towards Minimizing Read Time for Nand Flash".

*Primary Examiner* — Nadeem Iqbal
(74) *Attorney, Agent, or Firm* — Ryan, Mason & Lewis, LLP

(57) ABSTRACT

A read threshold voltage for a memory is adjusted based on a bit error rate based on decoded data for a plurality of read threshold voltages. The read threshold voltage can be adjusted by reading the memory at a current read threshold voltage to obtain a read value; applying a hard decision decoder to the read value; determining if the hard decision decoder converges for the read value to a converged word; storing bits corresponding to the converged word as reference bits and, if the hard decision decoder converges, (i) computing a bit error rate for the current read threshold voltage based on the reference bits; (ii) adjusting the current read reference voltage to a new read threshold voltage; and (iii) reading the memory at the new read threshold voltage to obtain a new read value, until a threshold is satisfied; and once the threshold is satisfied, selecting the read threshold voltage based on the bit error rates.

20 Claims, 10 Drawing Sheets

(56) References Cited

U.S. PATENT DOCUMENTS

| | | | |
|---|---|---|---|
| 9,431,130 B2 | 8/2016 | Sakurada | |
| 9,583,217 B2 | 2/2017 | Lin et al. | |
| 9,697,905 B2 | 7/2017 | Sharon et al. | |
| 2011/0182119 A1 | 7/2011 | Strasser et al. | |
| 2013/0139035 A1* | 5/2013 | Zhong | G11C 11/5642 714/773 |
| 2013/0343131 A1 | 12/2013 | Wu et al. | |
| 2014/0229131 A1* | 8/2014 | Cohen | G11C 16/0483 702/64 |
| 2014/0269052 A1 | 9/2014 | Dusija et al. | |
| 2014/0281750 A1* | 9/2014 | Jeon | G11C 16/3404 714/54 |
| 2014/0281772 A1* | 9/2014 | Jeon | G11C 16/3404 714/721 |
| 2015/0039842 A1 | 2/2015 | Fitzpatrick et al. | |
| 2015/0085573 A1 | 3/2015 | Sharon et al. | |
| 2015/0127883 A1* | 5/2015 | Chen | G11C 11/5642 711/103 |
| 2015/0149855 A1 | 5/2015 | Alhuissien et al. | |
| 2015/0149871 A1 | 5/2015 | Chen et al. | |
| 2015/0287453 A1 | 10/2015 | Wu et al. | |
| 2017/0148510 A1 | 5/2017 | Bazarsky et al. | |

\* cited by examiner

READ THRESHOLD VOLTAGE ADAPTATION USING BIT ERROR RATES BASED ON DECODED DATA

FIELD

The field relates generally to solid state storage devices, and more particularly, to techniques for adjusting read threshold voltages in such solid state storage devices.

BACKGROUND

Solid state storage devices, such as flash memory devices, typically distinguish between different binary values stored in a storage cell based on a read voltage level of the storage cell. Solid state storage devices typically compare read voltage levels to read threshold voltages to determine the data that may be stored in storage cells.

Characteristics of a storage cell, however, such as the read voltage levels, can change over time. For example, program-erase cycle, retention, read disturb and other physical artifacts can alter the read voltage levels of the storage cells. If the read voltage level of a storage cell shifts beyond a corresponding read voltage threshold, the stored data will not be properly read, since the value of the data read from the storage cell is different than the value of the data originally written to the storage cell.

A need therefore exists for improved techniques for adjusting read threshold voltages to account for such shifts in read voltage levels. A further need therefore exists for improved techniques for adjusting read threshold voltages based on bit error rates obtained based on decoded data.

SUMMARY

Illustrative embodiments of the present invention provide methods and apparatus for adjusting read threshold voltages in solid state storage devices. In one embodiment, an exemplary method comprises adjusting a read threshold voltage for a memory based on a bit error rate based on decoded data for a plurality of read threshold voltages. The read threshold voltage can be adjusted by reading the memory at a current read threshold voltage to obtain a read value; applying a hard decision decoder to the read value; determining if the hard decision decoder converges for the read value to a converged word; storing one or more bits corresponding to the converged word as reference bits and performing the following steps if the hard decision decoder converges for the read value: computing a bit error rate for the current read threshold voltage based on the reference bits; adjusting the current read reference voltage to a new read threshold voltage; reading the memory at the new read threshold voltage to obtain a new read value; repeating the computing, adjusting and reading steps until a threshold is satisfied for a number of read threshold voltages attempted; and once the threshold is satisfied, selecting the read threshold voltage based on the bit error rates computed for each repeated step.

In at least one exemplary embodiment, the bit error rate is estimated from a syndrome weight if the hard decision decoder does not converge for the current read threshold voltage and adjusts the current read reference voltage to the new read threshold voltage. In one or more embodiments of the invention, a new read threshold voltage for a next iteration can be selected based on one or more of a first bit error rate profile based on the bit error rates for a plurality of the read threshold voltages and a second bit error rate profile based on bit error rates from a syndrome weight for a plurality of the read threshold voltages. In at least one embodiment, a new read threshold voltage is selected for a next iteration based on one or more of a progression of bit error profiles based on the bit error rates for a plurality of the read threshold voltages and syndrome weight profiles for a plurality of the read threshold voltages.

A more complete understanding of the present invention, as well as further features and advantages of the present invention, will be obtained by reference to the following detailed description and drawings.

DETAILED DESCRIPTION

Illustrative embodiments of the present invention will be described herein with reference to exemplary solid state storage systems and other processing devices. It is to be appreciated, however, that the invention is not restricted to use with the particular illustrative system and device configurations shown.

Various aspects of the invention are directed to threshold voltage adjustment techniques for solid state memory devices, such as single-level cell (SLC) or multi-level cell (MLC) NAND (Not And) flash memory devices. As used herein, a multi-level cell flash memory comprises a memory where each memory cell stores two or more bits. While the invention is illustrated herein using memory cells that store an analog value as a voltage, the present invention can be employed with any storage mechanism for memory devices, such as the use of voltages or currents to represent stored data, as would be apparent to a person of ordinary skill in the art.

Aspects of the invention adjust a read threshold voltage for a memory using bit error rates based on decoded data to address variations in read threshold voltages as the solid state storage media evolves and/or degrades. In one exemplary embodiment, a controller adjusts a read threshold voltage for a memory using bit error rates that are obtained based, at least in part, on decoded data for a plurality of read threshold voltages. In at least one embodiment, a syndrome weight of a particular page is used to determine a bit error rate and a corresponding adjusted read threshold voltage.

According to a further aspect of the invention, a Smart-Scan feature is optionally employed to select an appropriate read voltage threshold for a next iteration based on a progression of bit error profiles or syndrome weight profiles or a combination of the two. Generally, the exemplary SmartScan feature dynamically adjusts read threshold voltages in an effort to reduce the total time of tracking.

Figure 1:
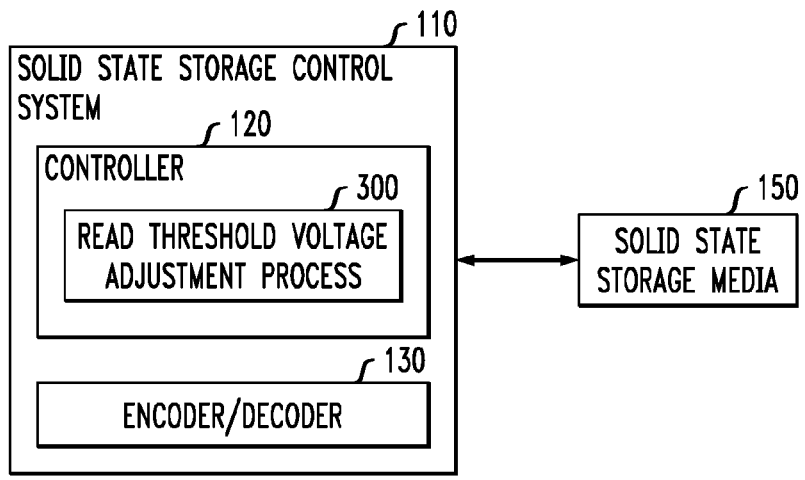
FIG. 1 is a schematic block diagram of a solid state storage system in which the present invention may be implemented.

FIG. 1 is a schematic block diagram of a solid state storage system 100. As shown in FIG. 1, the exemplary solid state memory system 100 comprises a solid state storage control system 110 and a solid state storage media 150. The exemplary solid state storage control system 110 comprises a controller 120 and an encoder/decoder block 130. In an alternative embodiment, the encoder/decoder block 130 may be implemented inside the controller 120.

As shown in FIG. 1, the controller 120 comprises a read threshold voltage adjustment process 300, discussed further below in conjunction with FIG. 3, to adjust read threshold voltages using bit error rates based on decoded data, in addition to other well-known functions. The encoder/decoder block 130 may be implemented, for example, using well-known commercially available techniques and/or products. The encoder within the encoder/decoder block 130 may implement, for example, error correction encoding, such as a low-density parity-check (LDPC) encoding. The decoder within the encoder/decoder block 130 may be embodied, for example, as a hard decision decoder, such as a hard decision low-density parity-check (HLDPC) decoder.

The solid state storage media 150 comprises a memory array, such as a single-level or multi-level cell flash memory, a NAND flash memory, a phase-change memory (PCM), a magneto-resistive random access memory (MRAM), a nano RAM (NRAM), a NOR flash memory, a dynamic RAM (DRAM) or another non-volatile memory (NVM). While the invention is illustrated primarily in the context of a multi-level cell NAND flash memory, the present invention can be applied to single-level cell flash memories and other non-volatile memories as well, as would be apparent to a person of ordinary skill in the art.

Figure 2A:
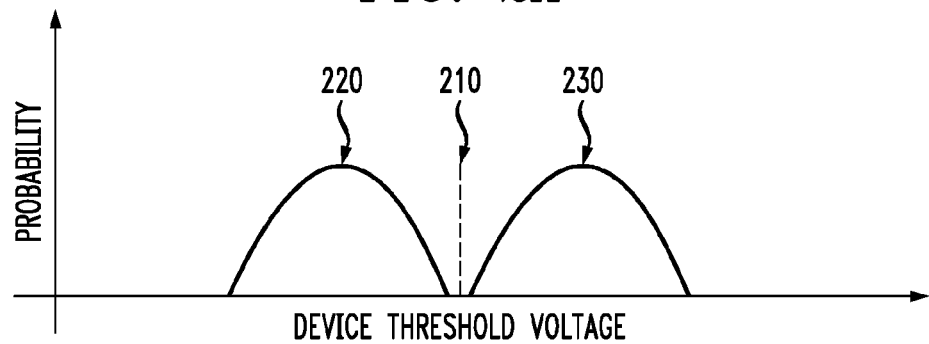
FIGS. 2A through 2D illustrate exemplary read threshold voltage distributions for the exemplary solid state storage media of FIG. 1.
Figure 2B:
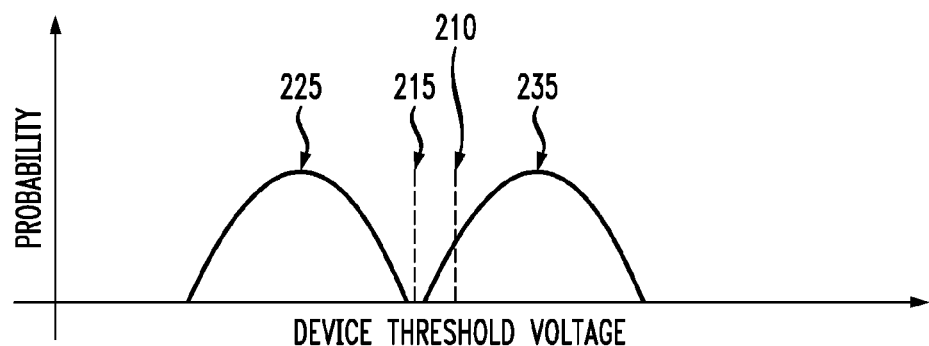

In a multi-level cell NAND flash memory, for example, a threshold detector is typically employed to translate the voltage value associated with a particular cell to a predefined memory state. FIGS. 2A through 2D illustrate device threshold voltage distributions. Generally, each peak in FIGS. 2A-2D is an abstraction for an independent Gaussian-like curve representing a device threshold voltage probability distribution for a respective state of a read unit sized portion of a non-volatile memory, such as the solid state storage media 150 of FIG. 1. The device threshold voltage axis is drawn with increasing positive voltage to the right. An absolute scale is purposefully not provided, and no reference points are identified, such that the plots apply more generally to a larger population of non-volatile memories. FIGS. 2A and 2B apply to SLC memories, while FIGS. 2C and 2D apply to MLC memories.

In FIG. 2A, representing an initial time (e.g., when the corresponding data is written), leftmost distribution 220 represents a logical one and the rightmost distribution 230 represents a logical zero. Depending on the technology, the leftmost distribution may reside (at least predominantly) at negative voltages. Read threshold 210 is ideally situated between the two distributions.

Except as linked by the embodiments herein, independent of these device threshold voltage distributions, in some embodiments, the NVM is written with specific knowledge of the statistical distribution of zeroes and ones being stored. More particularly, in some embodiments various encryption and/or scrambling techniques are used such that the statistical distribution of zeroes and ones is 50-50 percent (50 percent zeroes and 50 percent ones). When the SLC is read using the nominal read threshold, which is ideally situated for the case of FIG. 2A, the observed read data statistical distribution of zeroes and ones is likewise 50-50 percent. The statistical distribution being 50-50 percent does not mean that any one sample of data would have an exactly even balance of zero bits and one bits, but rather that an average over many samples produces a ratio of zero bits and one bits that converges on 50-50 percent with an increasingly tight probabilistic bound as a number of the samples increases.

In FIG. 2B, representing a later time than FIG. 2A, nominal read threshold 210 is as in FIG. 2A, and the two device threshold voltage distributions 225 and 235 are shifted with respect to their earlier respective distributions 220 and 230 in FIG. 2A. For the purposes of example, the two distributions are shown as having both uniformly shifted to the left (toward more negative voltages). It should be understood that more generally the two distributions are enabled to move independently of each other and in either a positive or a negative direction.

In view of FIG. 2B, when the SLC is again read using the nominal read threshold 210, it is predictable that the observed statistical distribution of zeroes and ones read directly from the non-volatile memory (e.g., prior to any error correction) will not be 50-50 percent. More particularly, for the conceptual example given, an erroneous excess of ones is to be expected, as the read threshold is such that some of the zeroes will be falsely read as ones.

In practice, the direction of inference is reversed. That is, in practice, generally such shifts in the device threshold voltage distributions are not known or directly knowable. With conventional techniques, the observation of a disparity in the zeroes and ones read from the non-volatile memory (with respect to the known stored distribution of zeroes and ones) is used to infer the existence of shifts in the device threshold voltage distributions. Furthermore, the read threshold is adjusted based at least in part on the disparity observed to read threshold 215, as required until the zero/one balance is restored. For a more detailed discussion of disparity-based adjustments to read threshold voltages, see, for example, United States Published Patent Application No. 2013/0343131, filed Jun. 26, 2012, entitled "Fast Tracking for Flash Channels," assigned to the assignee of the present application and incorporated by reference herein.

As discussed hereinafter, aspects of the present invention adjust a current read threshold voltage 210 to a new read threshold voltage 215 using bit error rates based on decoded data from decoder 130 to address variations in read threshold voltages as the SLC solid state storage media 150 evolves and/or degrades.

Figure 2C:
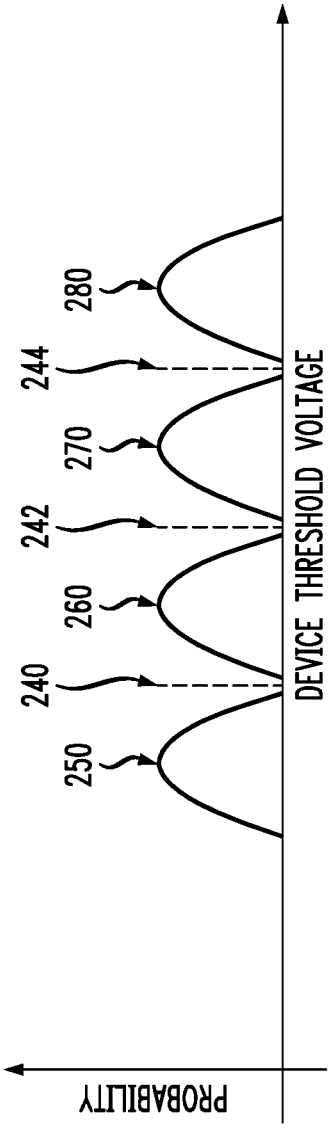
Figure 2D:
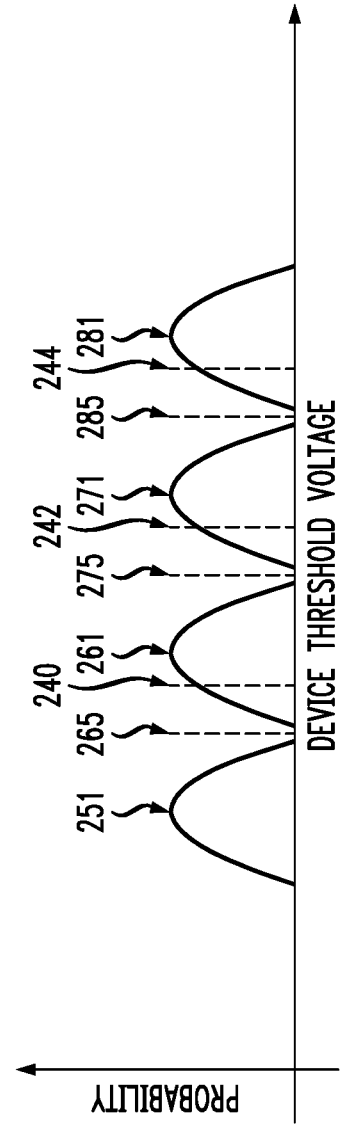

Similarly, FIG. 2C represents an initial time (such as when the corresponding data is written) with initial device threshold voltage distributions for an MLC device, while FIG. 2D represents a later time with corresponding later device threshold voltage distributions. In the exemplary embodiment shown in FIGS. 2C and 2D, each storage element employs four possible data states to store two bits of data in each memory cell.

More specifically, for a selected exemplary Gray code mapping, respectively representing the 11, 01, 00, and 10 states, device threshold voltage distributions 251, 261, 271, and 281 (of FIG. 2D) are shifted with respect to their earlier respective device threshold voltage distributions 250, 260, 270, and 280 (of FIG. 2C). Three nominal (initial) read thresholds are also shown: $V_{READ1}$ 240, $V_{READ2}$ 242, and $V_{READ3}$ 244. Again for the purposes of example, in FIG. 2D the four distributions are shown as having all uniformly shifted to the left (toward more negative voltages). It should be understood that more generally the four distributions are enabled to move independently of each other and in either a positive or negative direction.

Again, with conventional techniques, various scrambling techniques are used such that the statistical distribution of the four states is 25-25-25-25 percent (25 percent in each state). When the MLC is read using the nominal read threshold voltages that are ideally situated for the case of FIG. 2C, in some embodiments the statistical distribution of the four states is configurable to likewise be 25-25-25-25 percent. The observation of a disparity (e.g., a deviation from the expected 25-25-25-25 percent) read from the NVM (with respect to the known stored distribution of states) is used to infer the existence of shifts in the device threshold voltage distributions, in a similar manner to the SLC techniques discussed above in conjunction with FIGS. 2A and 2B. The read thresholds are then adjusted as shown in FIG. 2D to become $V_{READ1}$ 265, $V_{READ2}$ 275, and $V_{READ3}$ 285. The read threshold adjustments are often performed separately for lower page reads (adjusting $V_{READ2}$ 275) and upper page reads (adjusting $V_{READ1}$ 265 and/or $V_{READ3}$ 285).

As discussed hereinafter, aspects of the present invention adjust current read threshold voltages 240, 242, 244 for an MLC to new read threshold voltages 265, 275, 285, respectively, using bit error rates based on decoded data or bit-error rate estimates based on syndrome-weight from decoder 130 to address variations in read threshold voltages as the MLC solid state storage media 150 evolves and/or degrades.

Figure 3:
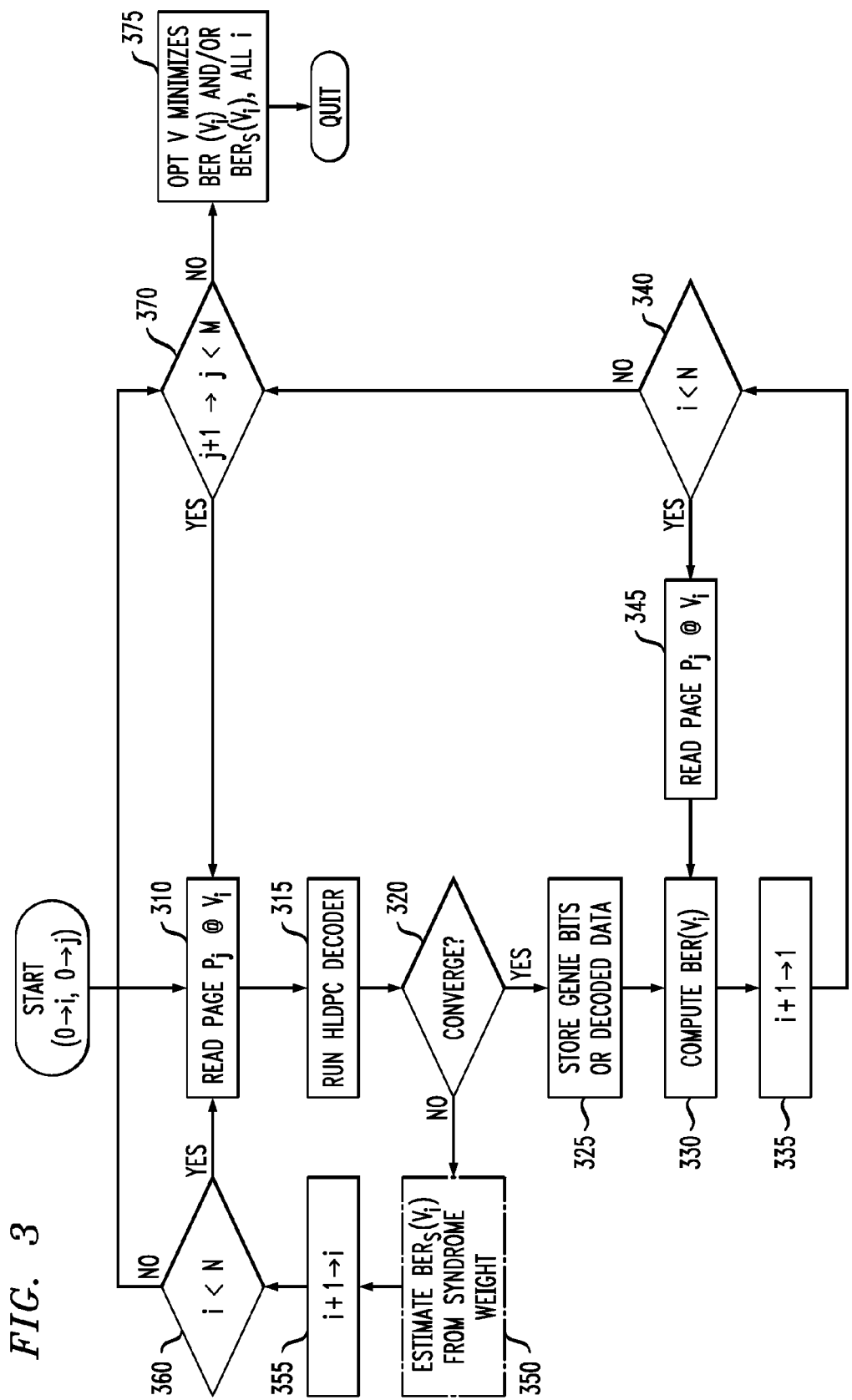
FIG. 3 is a flow chart illustrating an exemplary read threshold voltage adjustment process incorporating aspects of the present invention.

FIG. 3 is a flow chart illustrating an exemplary read threshold voltage adjustment process 300 incorporating aspects of the present invention. As shown in FIG. 3, when the exemplary read threshold voltage adjustment process 300 is initiated, counters i and j are initialized to zero. A given page $P_j$ is read during step 310 at a current read threshold voltage $V_i$ to obtain a read value.

A hard decision decoder, such as a hard decision low-density parity-check decoder, is applied to the read value during step 315.

A test is performed during step 320 to determine if the hard decision decoder converges for the read value to a converged word. If it is determined during step 320 that the hard decision decoder converges for the read value to a converged word, then the converged word (e.g., decoded data) is stored as genie bits (e.g., reference bits) during step 325. In addition, a bit error rate for the current read threshold voltage $V_i$ is computed during step 330 based on the reference bits stored during step 325. The bit error rate is computed by comparing a read value bit-by-bit against genie bits and the resultant number of mismatches is the number of bit errors. The bit error rate is the number of bit errors expressed as a fraction of the number of Genie Bits.

The read threshold voltage counter (i) is incremented during step 335 and a further test is performed during step 340 to determine if read threshold voltage counter (i) remains less than a threshold limit, N (e.g., a limit on the number of read threshold voltages attempted). If it is determined during step 340 that the read threshold voltage counter (i) remains less than the threshold limit, then the given page $P_j$ is read during step 345 for the new read threshold voltage $V_i$ to obtain a new read value.

If it was determined during step 340 that the read threshold voltage counter (i) is not less than a threshold limit, program control proceeds to step 370, discussed below.

If it was determined during step 320 that the hard decision decoder does not converge for the read value to a converged word for the permitted number of read threshold voltage attempts, then program control optionally proceeds to step 350 to estimate the bit error rate for the current read threshold voltage $V_i$ ($BER_S(V_i)$) from the syndrome weight of the given page $P_j$. Generally, a syndrome is an estimate of the number of bits in error, in a known manner. The syndrome weight can be obtained, for example, from a syndrome weight calculator or a hard decision decoder for a specified number of iterations. In further variations, syndrome weights can be computed without first checking for convergence in step 320, or syndrome weight-based estimation of error counts can be omitted entirely. Thus, in various implementations, the syndrome weight-based estimation of error counts in step 350 and the bit error rate computation for the current read threshold voltage $V_i$ in step 330 can be performed independently, or can be combined in the manner shown for the exemplary embodiment of FIG. 3.

The bit error rate can be computed from the syndrome weight, as follows:

$$\text{Syndrome} = Hx'$$

where x is the read value, H is the parity check matrix of a binary LDPC code and indicates a transpose operation. The syndrome is a vector of ones and zeroes, and the syndrome weight is the number of ones in the syndrome vector. A number of techniques exist to translate a syndrome weight to a bit error rate. For example, a syndrome weight can be translated to a bit error rate, as follows:

$$\text{Bit error rate estimate} = \text{Syndrome weight/average column weight of } H \text{ matrix.}$$

The read threshold voltage counter (i) is incremented during step 355 and a further test is performed during step 360 to determine if read threshold voltage counter (i) remains less than the threshold limit, N. If it is determined during step 360 that the read threshold voltage counter (i) remains less than the threshold limit, then the given page $P_j$ is read again during step 310 for the new read threshold voltage $V_i$ to obtain a new read value. The hard decision decoder is again applied to the current read value during step 315 and the convergence test is performed again during step 320, in the manner described above.

If it was determined during step 340 or 360 that the read threshold voltage counter (i) is not less than a threshold limit, then program control proceeds to step 370. The page counter (j) is incremented during step 370 and a further test is performed during step 370 to determine if the new value of page counter (j) remains less than a page limit, M. If it is determined during step 370 that the new value of page counter (j) remains less than the page limit, then program control proceeds to step 310 and continues in the manner described above to process the next page. If, however, it is determined during step 370 that the new value of the page counter (j) is not less than the page limit, then the read threshold voltage is selected during step 375 based on the bit error rates computed in the various iterations of steps 330 and/or 350. In at least one embodiment, the read threshold voltage is selected during step 375 that minimizes BER ($V_i$) and/or $BER_S(V_i)$, for all values of i. The exemplary read threshold voltage adjustment process 300 minimizes one or more bit error rate metrics during step 375 to obtain a substantially optimal read threshold voltage. In one embodiment, the read threshold voltage is optimized during step 375 using only the bit error rate based on the syndrome weight computed during step 350.

Figure 4:
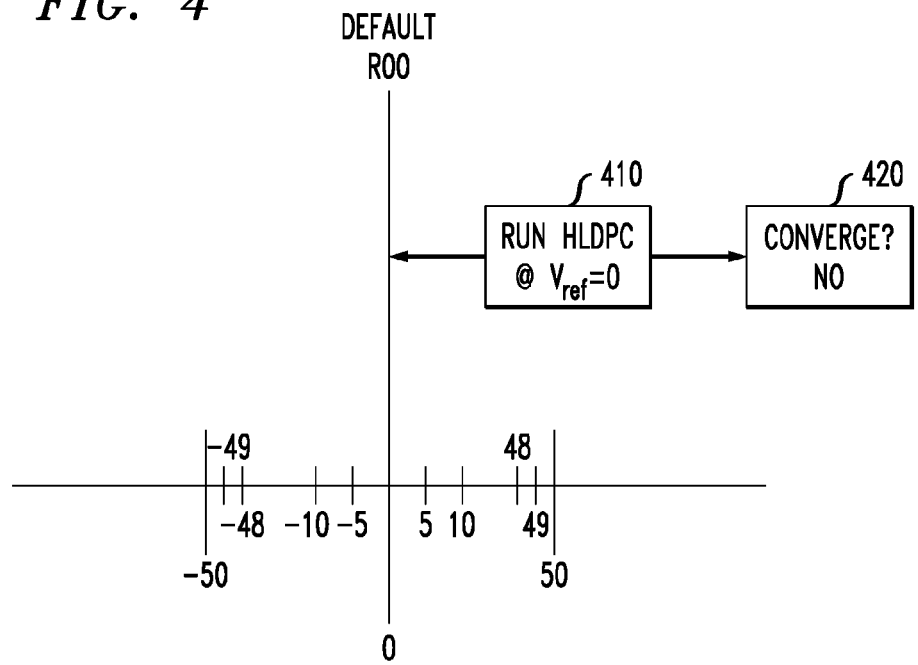
FIGS. 4 through 7 illustrate an execution of the exemplary read threshold voltage adjustment process of FIG. 3 for an exemplary lower page.

FIGS. 4 through 7 illustrate an execution of the exemplary read threshold voltage adjustment process 300 of FIG. 3 for an exemplary lower page of an MLC solid state storage media 150 of FIG. 1. As shown in FIG. 4, a particular lower page is read for a particular read threshold voltage to obtain a read value (corresponding to step 310 of FIG. 3). In the example of FIG. 4, the read threshold voltages can be adjusted using 101 reference increments in a range from −50 to +50 around a default read threshold voltage $R_{00}$. In the example of FIG. 4, a reference increment, $V_{ref}$, is equal to zero.

A hard decision decoder, such as an HLDPC decoder, is applied to the read value during step 410 (corresponding to step 315 of FIG. 3). A test is performed during step 420 to determine if the hard decision decoder converges for the read value to a converged word (corresponding to step 320 of FIG. 3). In the example of FIG. 4, the HLDPC decoder does not converge. In the exemplary read threshold voltage adjustment process 300, when the hard decision decoder does not converge, program control optionally proceeds to step 350 to estimate the bit error rate for the current read threshold voltage $V_i$ ($BER_S(V_i)$) from the syndrome weight of the given page $P_j$. The read threshold voltage counter (i) is incremented during step 355 and the page is read again for a new read threshold voltage to obtain a new read value. This sequence of steps continues until the HLDPC decoder converges, as shown in FIG. 5.

Figure 5:
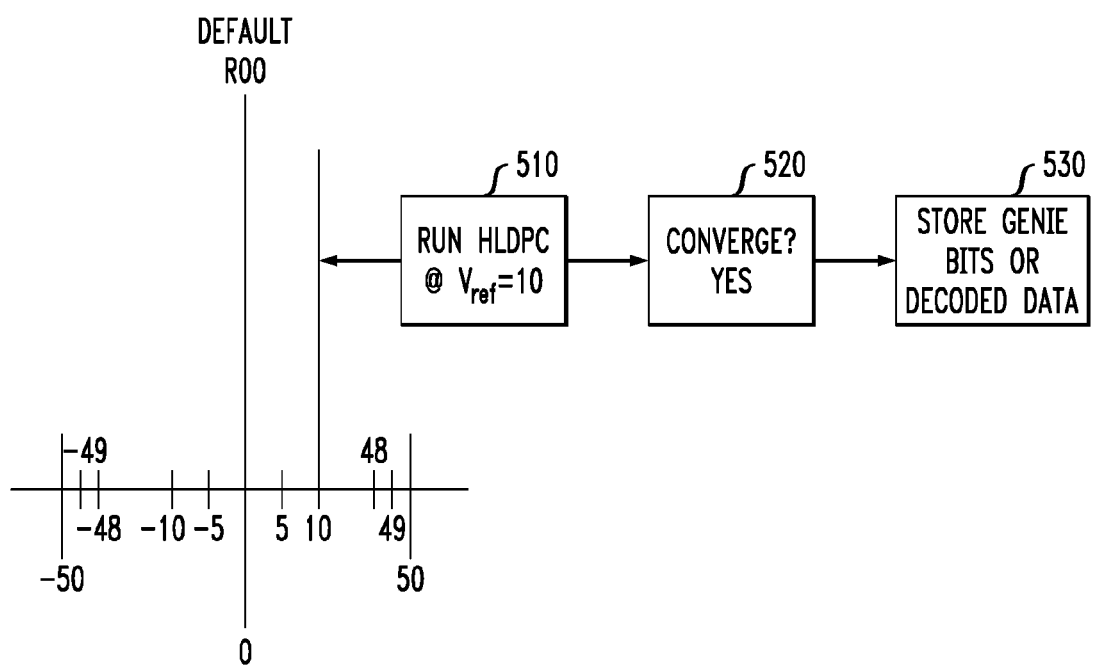

In the example of FIG. 5, the reference increment, $V_{ref}$, is equal to 10. The HLDPC decoder, is applied to the read value during step 510 (corresponding to step 315 of FIG. 3). A test is performed during step 520 to determine if the hard decision decoder converges for the read value to a converged word (corresponding to step 320 of FIG. 3). In the example of FIG. 5, the HLDPC decoder converges and the converged word (e.g., decoded data) is stored as genie bits (e.g., reference bits) during step 530 (corresponding to step 325 of FIG. 3).

Figure 6:
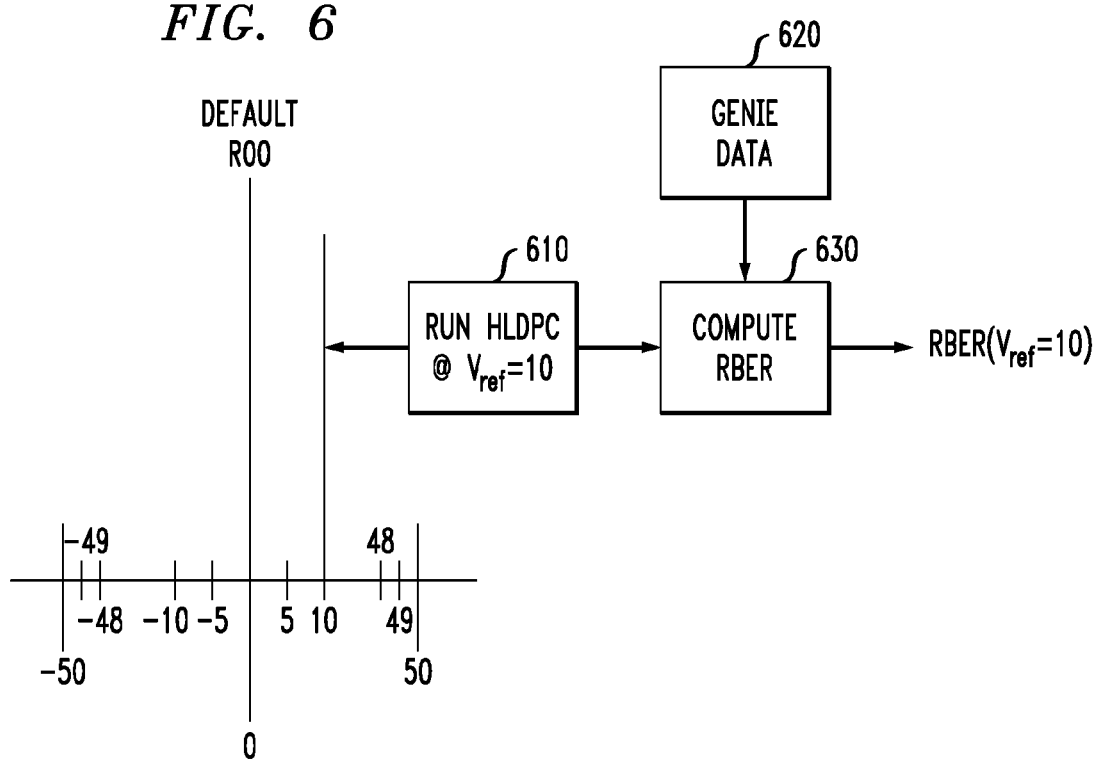

In the example of FIG. 6, the reference increment, $V_{ref}$, is initially still equal to 10 (following the convergence detected in FIG. 5). As shown in FIG. 6, the raw bit error rate (RBER) is computed during step 630 (corresponding to step 330 of FIG. 3) based on the genie data 620. The process shown in FIG. 6 is obtained for a plurality of read threshold voltages (for example, $V_{ref}$ equal to 8 and 12) as the read threshold voltage counter (i) is incremented during step 335 of FIG. 3. In this manner, the page is re-read for a plurality of read threshold voltages and the read values can be compared to the known genie bits obtained from the decoder.

Figure 7:
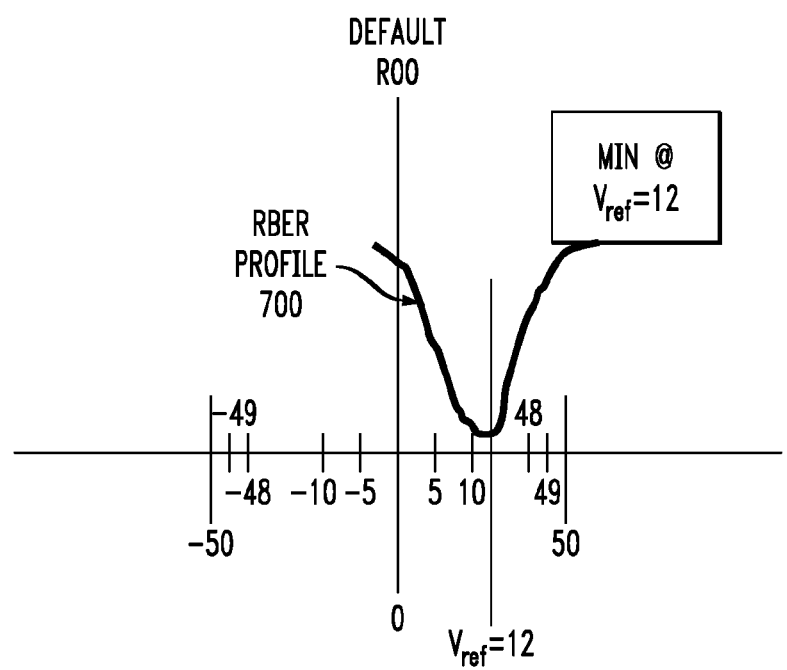

FIG. 7 illustrates an exemplary raw bit error rate profile 700 that is obtained by performing the steps illustrated in FIG. 6 for a plurality of read threshold voltages. As shown in FIG. 7, a substantially minimum RBER is observed for an exemplary reference increment, $V_{ref}$, equal to 12. This selection is made during step 375 of FIG. 3. Thus, the read threshold voltage corresponding to the reference increment, $V_{ref}$, equal to 12 will become the new read threshold voltage for the lower page.

Figure 8:
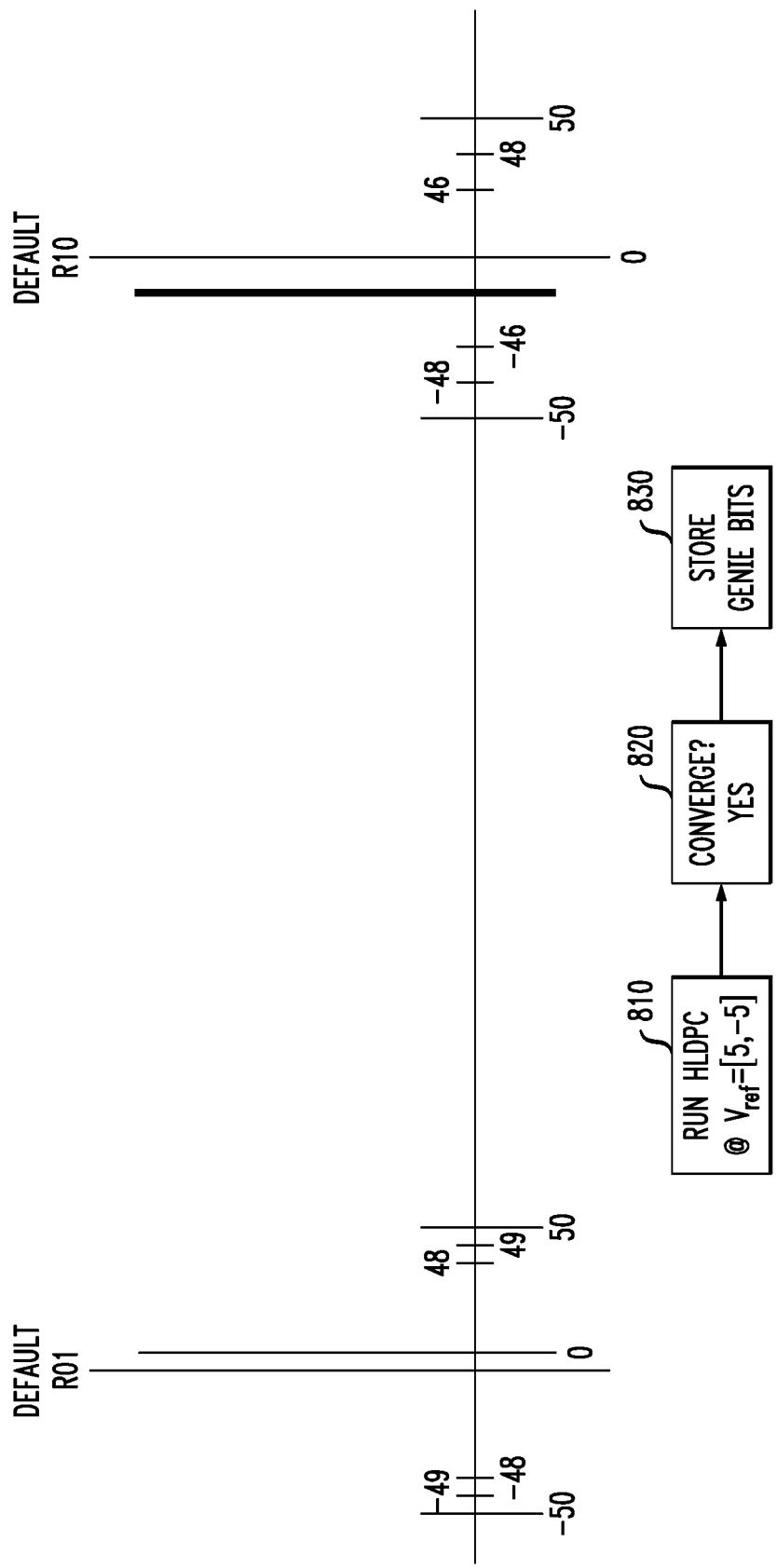
FIGS. 8 through 10 illustrate the execution of the exemplary read threshold voltage adjustment process of FIG. 3 for an exemplary upper page.
Figure 9:
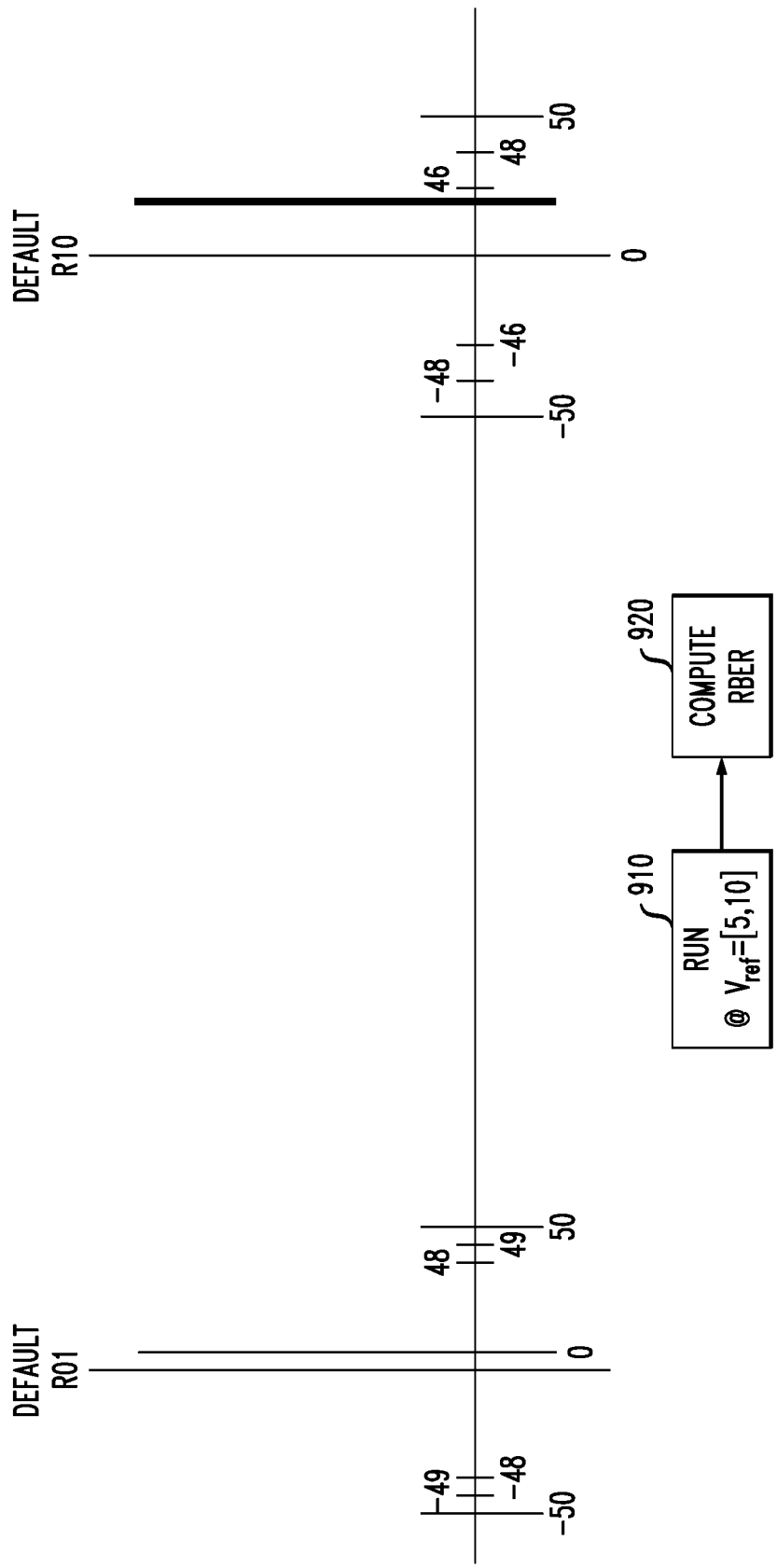
Figure 10:
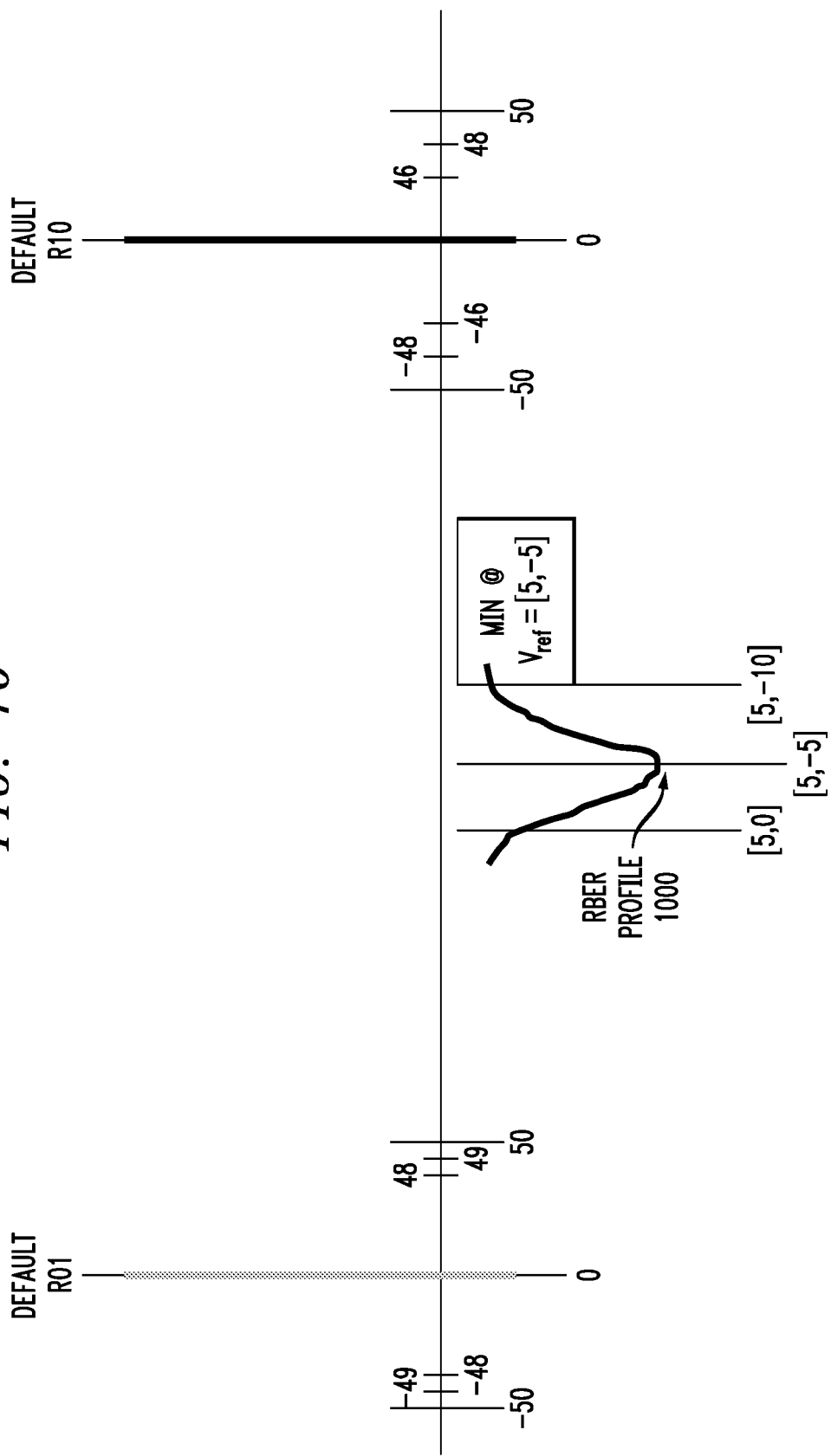

FIGS. 8 through 10 illustrate an execution of the exemplary read threshold voltage adjustment process 300 of FIG. 3 for an exemplary upper page of an MLC solid state storage media 150 of FIG. 1. As shown in FIG. 8, a particular upper page is read having two independent read threshold voltages to obtain two corresponding read values (corresponding to step 310 of FIG. 3). In the example of FIG. 8, the two read threshold voltages for the upper page can each be independently adjusted using 101 reference increments in a range from −50 to +50 around default read threshold voltages $R_{01}$ and $R_{10}$. It is noted that a single RBER profile is obtained for the upper page (since upper page forms a single codeword).

The two independent read threshold voltages for the upper page are incremented until the HLDPC decoder converges (corresponding to step 320 of FIG. 3).

In the example of FIG. 8, the reference increment, $V_{ref}$, for read threshold voltage $R_{01}$ is equal to 5 and the reference increment, $V_{ref}$, for read threshold voltage $R_{10}$ is equal to −5. The HLDPC decoder is applied to the read values during step 810 (corresponding to step 315 of FIG. 3). A test is performed during step 820 to determine if the hard decision decoder converges for the read value to a converged word (corresponding to step 320 of FIG. 3). In the example of FIG. 8, the HLDPC decoder converges. The genie bits are stored during step 830 for the current reference increments, $V_{refs}$.

In the example of FIG. 9, the reference increment, $V_{ref}$, for read threshold voltage $R_{01}$ is equal to 5 and the reference increment, $V_{ref}$, for read threshold voltage $R_{01}$ is equal to 10. The page is read during step 910 for the current reference increments, $V_{refs}$, and the RBER is computed for the current reference increments, $V_{refs}$, during step 920 using the genie bits. The steps shown in FIG. 9 are repeated for a plurality of reference increments, $V_{refs}$.

FIG. 10 illustrates an exemplary raw bit error rate profile 1000 that is obtained by performing the steps illustrated in FIG. 9 for a plurality of read threshold voltages. As shown in FIG. 10, a substantially minimum RBER is observed for an exemplary reference increment, $V_{ref}$, for read threshold voltage $R_{01}$ equal to 5 and an exemplary reference increment, $V_{ref}$, for read threshold voltage $R_{10}$ equal to −5. This selection is made during step 375 of FIG. 3. Thus, the read threshold voltages corresponding to the reference increment, $V_{ref}$, for read threshold voltage $R_{01}$ equal to 5 and the reference increment, $V_{ref}$, for read threshold voltage $R_{10}$ equal to −5 will become the new read threshold voltages for the upper page.

According to one or more embodiments, the read threshold voltage adjustment methods and processes described herein may be implemented in a controller as software, hardware, or any combination of the two.

For example, the methods and processes described herein may be stored in a memory as part of the firmware of a storage device and may be executed by a processor for performing the methods and processes described herein. The methods and processes described herein may alternatively or additionally be stored in other computer-readable media accessible by the controller. In further embodiments, the methods and processes described herein may be implemented in a computing system external to and operably connected to the storage device, such as in a driver module of a host device connected to storage device through an interface, for example. The methods and processes described herein may further be stored in a memory or other computer-readable media accessible by the computing system and be executed by a processor of the computing system.

In one variation, the read threshold voltage adjustment process 300 of FIG. 3 optionally employs a SmartScan feature, as discussed further below in conjunction with FIG. 11, to select an appropriate read voltage threshold for the next iteration based on the progression of bit error profiles or syndrome weight profiles or a combination of the two. Generally, the SmartScan feature dynamically adjusts read threshold voltages in an effort to reduce the total time of tracking. For example, if the read threshold voltage adjustment process 300 observes that the bit error count decreases when moving the read threshold voltage in a particular direction, then subsequent reads can be made at reference voltages further along that direction. In cases of deep retention, the SmartScan feature will significantly reduce the total number of reads performed by the read threshold voltage adjustment process 300. In a further example, read step size can be increased or decreased based on characteristics of the bit error profiles or syndrome weight profiles. For example, if the read threshold voltage adjustment process 300 detects that read threshold voltages near the valley of the profile (e.g., for substantially optimal read threshold voltages) are being processed, then the step size can be reduced. In addition, reduced step sizes can also be employed once the HLDPC decoder converges for additional granularity.

In a further variation, the SmartScan feature can track number of words read or processed at a given voltage and uses this quantity to improve reliability of optimal read threshold voltage estimate.

Figure 11:
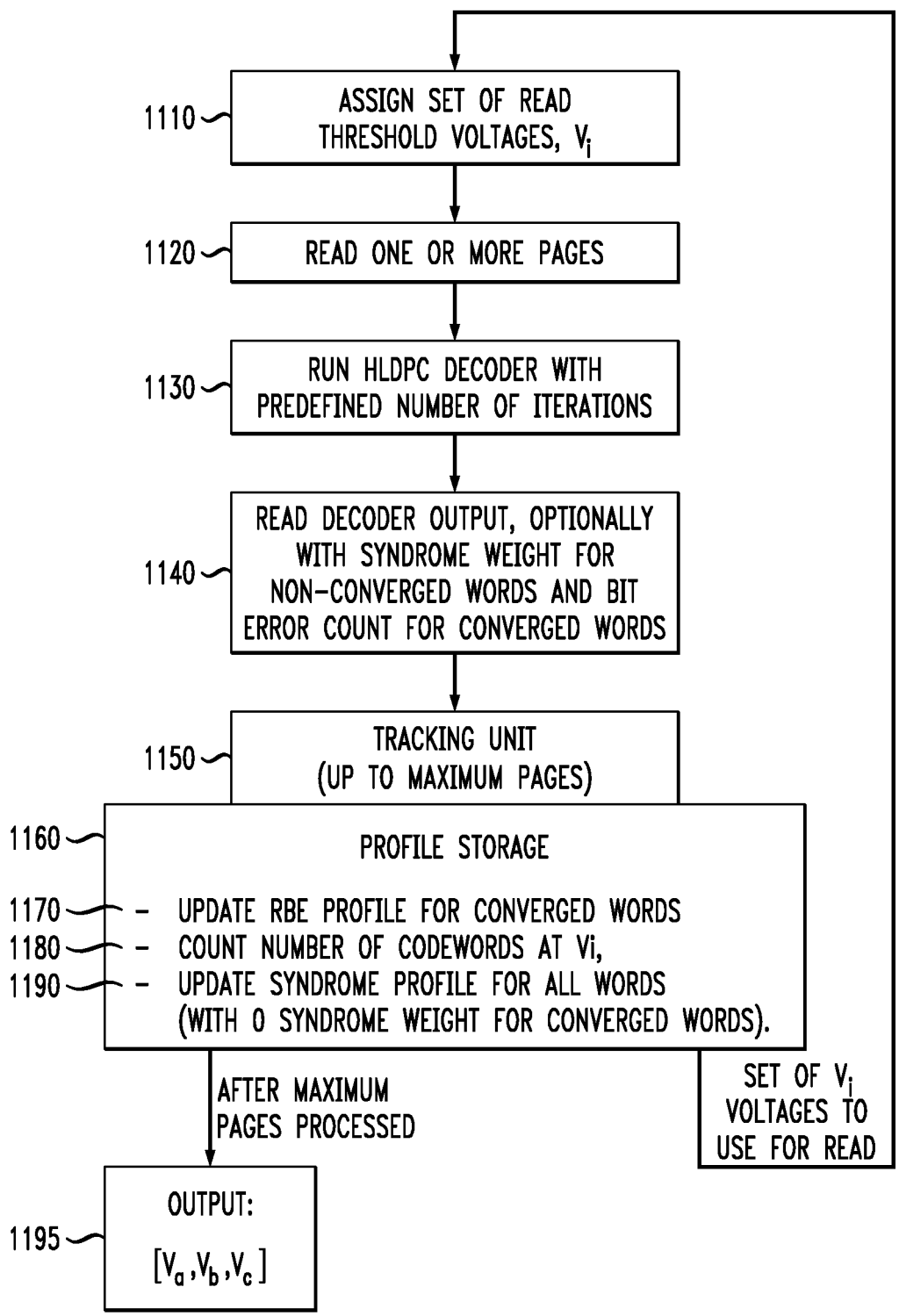
FIG. 11 is a flow chart illustrating an exemplary implementation of a smart scan process according to one embodiment of the invention.

FIG. 11 is a flow chart illustrating an exemplary implementation of a smart scan process 1100 according to one embodiment of the invention. As shown in FIG. 11, the smart scan process 1100 initially assigns a set of read threshold voltages, $V_i$, during step 1110. Thereafter, one or more page $P_j$ are read during step 1120 at a current read threshold voltage $V_i$ to obtain a read value.

An exemplary HLDPC decoder is executed during step 1130 with a predefined number of iterations (such as 2 or 3 iterations). The decoder output is obtained during step 1140, optionally with a syndrome weight for non-converged words and a bit error count for converged words.

A tracking unit 1150 updates profile values in a profile storage 1160, for a maximum number of pages. As shown in FIG. 11, a raw bit error profile is updated in step 1170 for converged words; a number of codewords is counted at the read threshold voltage, $V_i$, during step 1180; and a syndrome profile is updated in step 1190 for all Words (with a syndrome weight of 0 for converged words). A set of read threshold voltage, $V_i$, is applied in a feedback manner from the profile storage to step 1110 for the next read of one or more pages in step 1120. In this manner, As bit-error and syndrome-weight profiles develop over read operations, the next set of read voltages are generated based on these profiles 1160.

The population of the profile 1160 is delayed by the time it takes to process read encoded-words (or e-pages). Until then, a direction of scan may be pre-determined based on a flash characterization (e.g., using preset read threshold voltages set).

After a predefined maximum number of pages is processed, the read threshold voltages, $V_a$, $V_b$, and $V_c$, are output at step 1195.

It is noted that read operations can be performed in parallel to reduce read times by spreading read operations across a plurality of dies. It is further noted that reads across dies may be performed at different read threshold voltages (i.e., not all pages across dies have to be read at the same threshold voltage).

In addition, the SmartScan feature can adjust a read-step size based upon the characteristics of the profiles 1160.

CONCLUSION

The foregoing applications and associated embodiments should be considered as illustrative only, and numerous other embodiments can be configured using the read threshold voltage adjustment techniques disclosed herein. For example, the read threshold voltage adjustment process 300 of FIG. 3 can be executed with just the syndrome weight (i.e., using the left side of FIG. 3). In a further variation, the read threshold voltage adjustment process 300 of FIG. 3 can be executed with just the bit error rate metric (i.e., using the right side of FIG. 3).

Among other benefits, the disclosed read threshold voltage adjustment techniques improve endurance of the solid state storage devices (often referred to as Life Extension) and reduce latency and performance metrics.

It should also be understood that read threshold voltage adjustment techniques, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The exemplary read threshold voltage adjustment process 300 may be implemented using one or more processing platforms. One or more of the processing modules or other components may therefore each run on a computer, storage device or other processing platform element. A given such element may be viewed as an example of what is more generally referred to herein as a "processing device."

Figure 12:
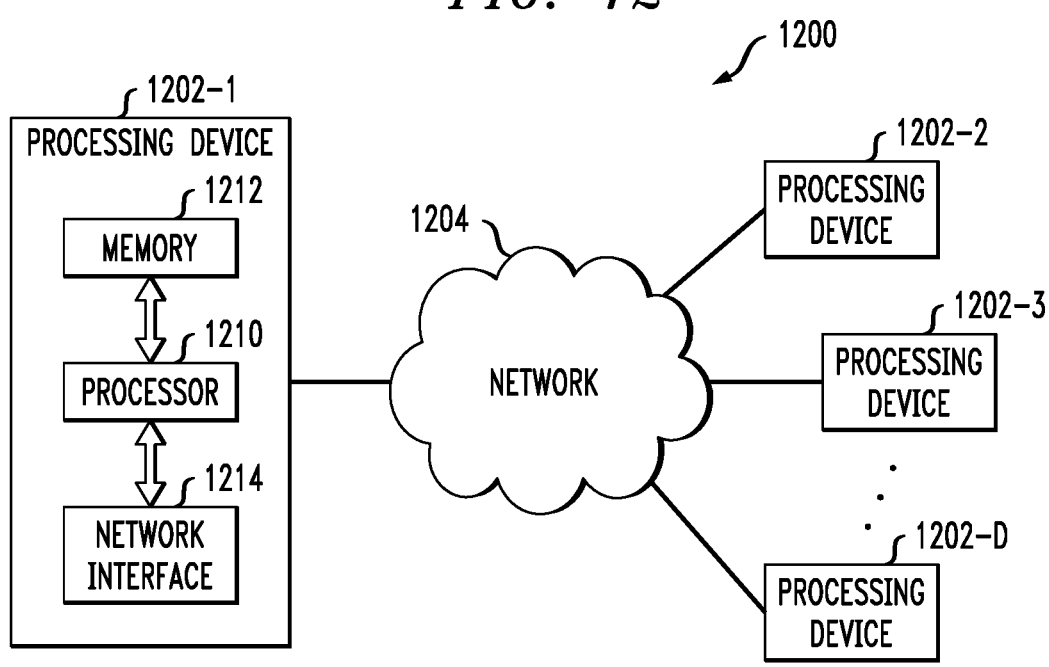
FIG. 12 illustrates an exemplary processing platform that may be used to implement at least a portion of one or more embodiments of the invention.

Referring now to FIG. 12, one possible processing platform that may be used to implement at least a portion of one or more embodiments of the invention is shown. The processing platform 1200 in this embodiment comprises at least a portion of the given system and includes at least one processing device(s), denoted 1202-1, 1202-2, 1202-3, . . . 1202-D, which communicate with one another over a network 1204. The network 1204 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 1202-1 in the processing platform 1200 comprises a processor 1210 coupled to a memory 1212. The processor 1210 may comprise a microprocessor, a microcontroller, an application specific integrated circuit (ASIC), a field programmable gate array (FPGA) or other type of processing circuitry, as well as portions or combinations of such circuitry elements, and the memory 1212, which may be viewed as an example of a "computer program product" having executable computer program code embodied therein, may comprise random access memory (RAM), read only memory (ROM) or other types of memory, in any combination.

Also included in the processing device 1202-1 is network interface circuitry 1214, which is used to interface the processing device with the network 1204 and other system components, and may comprise conventional transceivers.

The other processing devices 1202, if any, of the processing platform 1200 are assumed to be configured in a manner similar to that shown for processing device 1202-1 in the figure.

Again, the particular processing platform 1200 shown in the figure is presented by way of example only, and the given system may include additional or alternative processing platforms, as well as numerous distinct processing platforms in any combination, with each such platform comprising one or more computers, storage devices or other processing devices.

Multiple elements of system may be collectively implemented on a common processing platform of the type shown in FIG. 12, or each such element may be implemented on a separate processing platform.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

It should again be emphasized that the above-described embodiments of the invention are presented for purposes of illustration only. Many variations and other alternative embodiments may be used. For example, the techniques are applicable to a variety of other types of solid state storage media that can benefit from the read threshold voltage adjustment processes as disclosed herein. Also, the particular configuration of processing device elements shown herein, and the associated read threshold voltage adjustment techniques, can be varied in other embodiments. Moreover, the various simplifying assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A device comprising:
    a controller configured to adjust a read threshold voltage for one or more pages of a memory based on a syndrome weight for a plurality of read threshold voltages until decoded data is available from a decoder to calculate a bit error rate based on the decoded data.

2. The device of claim 1, wherein the controller adjusts the read threshold voltage by:
    reading the memory at a current read threshold voltage to obtain a read value;
    applying a hard decision decoder to the read value;
    determining if the hard decision decoder converges for the read value to a converged word to provide the available decoded data;
    storing one or more bits corresponding to the converged word as reference bits; and
    selecting the read threshold voltage based on one or more bit error rates.

3. The device of claim 2, wherein the controller performs the following steps if the hard decision decoder converges for the read value to provide the available decoded data:
    computing a bit error rate for the current read threshold voltage based on the reference bits;
    adjusting a current read reference voltage to a new read threshold voltage;
    reading the memory at the new read threshold voltage to obtain a new read value;
    repeating the computing, adjusting and reading steps until a threshold is satisfied for a number of read threshold voltages attempted; and
    once the threshold is satisfied, selecting the read threshold voltage based on the bit error rates computed for each repeated step.

4. The device of claim 3, wherein the controller estimates the bit error rate from the syndrome weight if the hard decision decoder does not converge for the current read threshold voltage and adjusts the current read reference voltage to the new read threshold voltage.

5. The device of claim 2, wherein the controller determines a count profile based on a number of errors detected in one or more of a number of words read and a number of encoded pages.

6. The device of claim 3, wherein the controller selects the new read threshold voltage based on one or more of a first bit error rate profile based on the bit error rates associated with the available decoded data for a plurality of the read threshold voltages and a second bit error rate profile based on bit error rates from the syndrome weight for a plurality of the read threshold voltages.

7. The device of claim 6, wherein the selection of the new read threshold voltage is further based on a count profile based on a number of errors detected in one or more of a number of words read and a number of encoded pages.

8. The device of claim 1, wherein the controller selects a new read threshold voltage for a next iteration based on one or more of a progression of bit error profiles based on the bit error rates for a plurality of the read threshold voltages, syndrome weight profiles for a plurality of the read threshold voltages, a number of words read at a given read threshold voltage and a number of words processed at a given read threshold voltage.

9. The device of claim 1, wherein the controller adjusts the read threshold voltage by:
    reading the memory at a current read threshold voltage to obtain a read value;
    estimating the bit error rate from the syndrome weight, wherein the syndrome weight is obtained from one or more of a syndrome weight calculator and a hard decision decoder for a specified number of iterations; and
    selecting a new read threshold voltage based on a second bit error rate profile based on the bit error rate from the syndrome weight for a plurality of the read threshold voltages.

10. A tangible machine-readable recordable storage medium, wherein one or more software programs when executed by one or more processing devices implement the following step:
    adjust a read threshold voltage for one or more pages of a memory based on a syndrome weight for a plurality of read threshold voltages until decoded data is available from a decoder to calculate a bit error rate based on the decoded data.

11. The storage medium of claim 10, wherein the read threshold voltage is adjusted by performing the following steps:
    reading the memory at a current read threshold voltage to obtain a read value;
    applying a hard decision decoder to the read value;
    determining if the hard decision decoder converges for the read value to a converged word to provide the available decoded data;

storing one or more bits corresponding to the converged word as reference bits and performing the following steps if the hard decision decoder converges for the read value to provide the available decoded data:

computing a bit error rate for the current read threshold voltage based on the reference bits;

adjusting the current read reference voltage to a new read threshold voltage;

reading the memory at the new read threshold voltage to obtain a new read value;

repeating the computing, adjusting and reading steps until a threshold is satisfied for a number of read threshold voltages attempted; and once the threshold is satisfied, selecting the read threshold voltage based on the bit error rates computed for each repeated step.

12. The storage medium of claim 11, further comprising the step of selecting the new read threshold voltage based on one or more of a first bit error rate profile based on the bit error rates associated with the available decoded data for a plurality of the read threshold voltages and a second bit error rate profile based on bit error rates from the syndrome weight for a plurality of the read threshold voltages.

13. A method, comprising:

obtaining a bit error rate based on a syndrome weight for a plurality of read threshold voltages until decoded data is available from a decoder to calculate a bit error rate based on the decoded data;

adjusting a read threshold voltage for a memory based on the bit error rate.

14. The method of claim 13, wherein the read threshold voltage is adjusted by performing the following steps:

reading the memory at a current read threshold voltage to obtain a read value;

applying a hard decision decoder to the read value;

determining if the hard decision decoder converges for the read value to a converged word to provide the available decoded data;

storing one or more bits corresponding to the converged word as reference bits; and selecting the read threshold voltage based on one or more bit error rates.

15. The method of claim 14, further comprising the following steps if the hard decision decoder converges for the read value to provide the available decoded data:

computing a bit error rate for the current read threshold voltage based on the reference bits;

adjusting the current read reference voltage to a new read threshold voltage;

reading the memory at the new read threshold voltage to obtain a new read value;

repeating the computing, adjusting and reading steps until a threshold is satisfied for a number of read threshold voltages attempted; and once the threshold is satisfied, selecting the read threshold voltage based on the bit error rates computed for each repeated step.

16. The method of claim 15, further comprising the step of estimating the bit error rate from the syndrome weight if the hard decision decoder does not converge for the current read threshold voltage and adjusts the current read reference voltage to the new read threshold voltage.

17. The method of claim 15, further comprising the step of determining a count profile based on a number of errors detected in one or more of a number of words read and a number of encoded pages.

18. The method of claim 15, further comprising the step of selecting the new read threshold voltage based on one or more of a first bit error rate profile based on the bit error rates associated with the available decoded data for a plurality of the read threshold voltages and a second bit error rate profile based on bit error rates from the syndrome weight for a plurality of the read threshold voltages.

19. The method of claim 18, wherein the selection of the new read threshold voltage is further based on a count profile based on a number of errors detected in one or more of a number of words read and a number of encoded pages.

20. The method of claim 15, further comprising the step of selecting a new read threshold voltage for a next iteration based on one or more of a progression of bit error profiles based on the bit error rates for a plurality of the read threshold voltages, syndrome weight profiles for a plurality of the read threshold voltages, a number of words read at a given read threshold voltage and a number of words processed at a given read threshold voltage.

* * * * *